(12) United States Patent
Karakaya et al.

(10) Patent No.: US 8,154,176 B2
(45) Date of Patent: Apr. 10, 2012

(54) SYSTEM AND METHOD FOR RESONANCE FREQUENCY TUNING OF RESONANT DEVICES

(75) Inventors: Koray Karakaya, Eindhoven (NL); Dennis Hohlfeld, Veldhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 264 days.

(21) Appl. No.: 12/420,045

(22) Filed: Apr. 7, 2009

(65) Prior Publication Data
US 2009/0284102 A1 Nov. 19, 2009

Related U.S. Application Data

(60) Provisional application No. 61/042,923, filed on Apr. 7, 2008.

(51) Int. Cl.
*H01L 41/08* (2006.01)
*H02N 2/18* (2006.01)
*H01L 41/107* (2006.01)

(52) U.S. Cl. ......... 310/339; 310/331; 310/332; 310/330

(58) Field of Classification Search .......... 310/330–332, 310/339
See application file for complete search history.

(56) References Cited

U.S. PATENT DOCUMENTS

| | | | | |
|---|---|---|---|---|
| 3,457,463 A * | 7/1969 | Balamuth | | 310/339 |
| 4,536,674 A * | 8/1985 | Schmidt | | 310/339 |
| 4,874,215 A | 10/1989 | Montagu | | |
| 6,263,763 B1 | 7/2001 | Feigel, Jr. et al. | | |
| 6,311,557 B1 | 11/2001 | Davis et al. | | |
| 6,336,366 B1 | 1/2002 | Thundat et al. | | |
| 6,870,306 B2 * | 3/2005 | Ajioka | | 310/328 |
| 6,943,484 B2 | 9/2005 | Clark et al. | | |
| 7,166,952 B2 * | 1/2007 | Topliss et al. | | 310/330 |
| 7,449,817 B2 * | 11/2008 | Kato et al. | | 310/331 |
| 7,449,818 B2 * | 11/2008 | Kato et al. | | 310/331 |
| 7,667,369 B2 * | 2/2010 | Haskell et al. | | 310/331 |
| 7,692,365 B2 * | 4/2010 | Churchill et al. | | 310/339 |
| 2011/0061310 A1 * | 3/2011 | Browne et al. | | 52/1 |

OTHER PUBLICATIONS

Davis et al., "An actively tuned solid-state vibration absorber using capacitive shunting of piezoelectric stiffness," Journal of Sound and Vibration, 232(3):601-607 (2000).
Kawai et al., "Piezoelectic actuator integrated cantilever with tunable spring constant for atom probe," MEMS 206, Itanbul (Jan. 22-26, 2006).
Leland et al, "Resonance tuning of piezoelectric vibration energy scavenging generators using compressive axial preload," Smart Materials and Structures 15, 1413-1420 (2006).

* cited by examiner

*Primary Examiner* — Jaydi San Martin
(74) *Attorney, Agent, or Firm* — McDonnell Boehnen Hulbert & Berghoff LLP

(57) ABSTRACT

Tunable vibration energy scavengers and methods of operating the same are disclosed. The disclosed energy scavengers comprise a beam with a main body, wherein the beam comprises at least one flap and means for changing a shape of the at least one flap, wherein the at least one flap is physically attached to the main body along a longitudinal side of the main body. The disclosed methods comprise tuning the shape of the at least one flap, thereby tuning the stiffness of the structure.

14 Claims, 8 Drawing Sheets

SYSTEM AND METHOD FOR RESONANCE FREQUENCY TUNING OF RESONANT DEVICES

BACKGROUND

The present disclosure relates to methods for tuning the stiffness of a structure, and in particular to methods for tuning the stiffness of a structure by changing the shape of the structure, including, for example, changing the shape of the structure by piezoelectric means. The disclosure further relates to methods for resonance frequency tuning of resonating structures, such as for example, vibration energy scavengers. Furthermore it relates to tunable devices, such as vibration energy scavengers or sensors.

Future wireless sensor networks may comprise sensor nodes which occupy a volume of typically a few $cm^3$. The scaling down of batteries for powering such sensor nodes faces technological restrictions as well as a loss in storage density. For this reason, it would be desirable to replace batteries with more efficient, miniaturized power sources. Energy scavengers based on the recuperation of wasted ambient energy are one possible alternative to batteries. Several scavenger concepts have been proposed, including concepts based on the conversion of thermal energy, pressure energy, or kinetic energy.

Kinetic energy scavengers or vibration energy scavengers convert energy in the form of mechanical movement (e.g. in the form of vibrations or random displacements) into electrical energy. For conversion of kinetic energy into electrical energy, different conversion mechanisms may be employed, such as, for example, conversion mechanisms based on piezoelectric, electrostatic, or electromagnetic mechanisms. Piezoelectric scavengers employ active materials that generate a charge when mechanically stressed. Electrostatic scavengers utilize the relative movement between electrically isolated charged capacitor plates to generate energy. Electromagnetic scavengers are based on Faraday's law of electromagnetic induction, and generate electrical energy from the relative motion between a magnetic flux gradient and a conductor.

A vibration energy scavenger has the maximum power output when input vibrations closely match its resonance frequency. The resonance frequency of a vibration energy scavenger is determined by the material properties and the dimensions of the scavenger's parts. However, in practical applications, input vibrations may occur in a wide frequency spectrum. Therefore, the vibration energy scavenger structure stays out of resonance as the input vibration frequency changes, and it generates very low power or no power at all. It would be advantageous to have a single device that operates effectively over a range of input vibration frequencies.

Resonance frequency tuning of oscillating structures is a common practice in vibration isolation, such as in various MEMS resonators, etc. The concept is based on changing the resonance frequency of a cantilever by changing its stiffness. Several methods such as piezoelectric tuning (e.g. U.S. Pat. No. 6,336,366 and U.S. Pat. No. 6,943,484), magnetic tuning (U.S. Pat. No. 6,311,557), electrostatic tuning (U.S. Pat. No. 6,263,736) and thermal tuning (U.S. Pat. No. 4,874,215) of MEMS systems have been presented.

In U.S. Pat. No. 6,336,366, a piezoelectric tuning effect is obtained by applying a piezoelectric stack (electrode/piezoelectric layer/electrode) on a cantilever structure. When an electrical potential is applied between both electrodes of the piezoelectric stack, piezoelectric action in the piezoelectric layer changes the stiffness of the piezoelectric material, hence alters the effective stiffness of the resonating cantilever and thus changes its resonance frequency. The method is based on the stress change in the piezoelectric stack as a function of the applied electrical field and therefore the tuning effect is limited by the thickness ratio of the piezoelectric layer and the oscillating cantilever beam.

In U.S. Pat. No. 6,943,484 a tuning effect is obtained by controlling the amount of capacitive shunting achieved by an external 'tuning capacitor' connected in parallel to a passive piezoelectric stack on an oscillating beam. Electrically shunting the piezoelectric stack changes the effective stiffness of the beam and thus the resonance frequency. The limits of the stiffness change by capacitive shunting are at the open circuit stiffness and the short circuit stiffness, which are related by the electromechanical coupling coefficient of the piezoelectric stack. These limits are theoretically and experimentally investigated by C. Davis and G. Lesieutre in "An actively tuned solid-state vibration absorber using capacitive shunting of piezoelectric stiffness", Journal of Sound and Vibration, 232(3), 601-617, 2000. In practice, the stiffness of the piezoelectric element is in parallel with the inherent mechanical stiffness of the whole resonator. The relative magnitudes of these two stiffnesses determine the net frequency change possible via electrical shunting. Therefore, only a fraction of the net device stiffness may be changed by electrical shunting.

In "Piezoelectric actuator integrated cantilever with tunable spring constant for atom probe", MEMS 2006, Istanbul, 22-26 Jan. 2006, Y. Kawai et al present the use of a piezoelectric tuning actuator for changing the geometrical aspects of a cantilever structure, thereby changing the stiffness of the cantilever structure. They employed an integrated piezoelectric actuator for bending the cantilever along the lateral direction for changing its cross section profile, thus changing its stiffness. An additional piezoelectric actuator is provided for deforming the whole cantilever beam's shape in the longitudinal direction. The stiffness of the structure is changed by a change in moment of inertia. However, this method is applied on a very small structure for probing applications (e.g. AFM tips), wherein the thickness of the cantilever is in the order of a few $\mu m$ (e.g. 1 to 2 $\mu m$), the length of the cantilever is typically in the order of 750 $\mu m$ and the cantilever comprises 2 beams with a width in the order of 50 $\mu m$, the total width being in the order of 300 $\mu m$. The structure presented is designed for cantilever structures with a relatively low stiffness and for large actuation needs. The stiffness tuning mechanism is used for removing the artifacts of low stiffness in the scanning mode. The load at the tip of the cantilever is negligible since it is used for picking up a single atom or molecule. The relatively small dimensions and the relatively low stiffness of the structure allow bending the whole cantilever beam by piezoelectric actuators for manipulating its stiffness.

The power generated in vibration energy harvesting devices is proportional to the attached proof mass. For fulfilling the power requirements (e.g. >100 $\mu W$) and for achieving structural rigidity with a large mass, relatively large beams or cantilevers with a length and a width in the order of millimeters and a thickness in the order of tens of micrometers are needed. Therefore, the structure described by Kawai et al., wherein the cantilever structure is optimized for low stiffness applications and for large actuation needs, is not suitable for tuning the resonance frequency of vibration energy scavengers.

There are a limited number of studies related to tuning the resonance frequency of vibration energy scavengers. For example, in "Resonance tuning of piezoelectric vibration energy scavenging generators using compressive axial preload", Smart Materials and Structures 15, 2006, 1413-1420, Leland et al. describe a method wherein axial forces are used for changing the effective stiffness of the oscillating structure. In this approach, a simply supported piezoelectric bimorph is used as an active element, with a proof mass mounted at the bimorph's center. A variable compressive axial preload is applied to the bimorph, reducing its stiffness and thus the resonance frequency of the device. The stiffness decrease is a function of the load applied in a given system. However, the change in the apparent stiffness is inversely proportional to the initial stiffness. This means that the largest tuning effect can be achieved by starting with a low stiffness. Besides the relatively low stiffness requirement, the maximum axial load applied to the structure is determined by the buckling load, which is lower in a low stiffness system. In addition, it may be difficult to fabricate the system proposed by means of micromachining methods.

SUMMARY

The present disclosure relates to systems and methods for tuning the stiffness of a structure by changing its shape, including methods allowing tuning a resonance frequency of a resonating structure, such as for example a structure comprising a beam or a cantilever. The disclosed methods are particularly suitable for tuning the resonance frequency of vibration energy scavengers, and a wide tuning range may be obtained. Furthermore, the present disclosure relates to devices that can be tuned according to the disclosed methods, wherein the devices may be fabricated by means of micromachining techniques.

The phrases "tuning the stiffness" or "tuning the resonance frequency" are used throughout this document to refer to changing or reversibly adapting the stiffness or resonance frequency.

A method is disclosed for tuning the stiffness, and hence the resonance frequency, of a structure, wherein the method comprises: providing the structure comprising a beam with a main body and at least one flap located along a longitudinal side of the main body, the at least one flap being physically attached to the main body; and tuning a shape of the at least one flap, thereby tuning the stiffness of the structure, and thus its resonance frequency. Tuning a shape of the at least one flap may comprise tuning a curvature of the at least one flap. Tuning a shape of the at least one flap may comprise actuating an actuator, for example a piezoelectric actuator, on the at least one flap, for example by providing an electrical potential between a bottom electrode and a top electrode of a piezoelectric actuation stack.

The method for tuning a resonance frequency of a structure, for example an oscillating structure, may for example be used for tuning the resonance frequency of a MEMS or NEMS device, or for tuning the resonance frequency of a vibration energy scavenger, or for tuning the resonance frequency of a sensor that can operate at multiple resonance frequencies for multiple sensitivity scales.

In another aspect, the present disclosure further provides a resonant device, for example a piezoelectric vibration energy scavenger, with tunable resonance frequency. The resonant device comprises at least one beam comprising a main body, wherein the at least one beam comprises at least one flap located along a longitudinal side of the main body and being physically attached to the main body, and means for changing a shape of the at least one flap. The means for changing a shape of the at least one flap may comprise a piezoelectric actuator, such as a piezoelectric stack comprising a bottom electrode, a piezoelectric material layer and a top electrode, located on a surface of the at least one flap. A seismic mass may be attached to the at least one beam.

The at least one beam may for example be a cantilever structure or a beam that is clamped at two sides. The thickness of the at least one flap may be at least a factor of 10 smaller than the thickness of the main body.

The resonant device may for example be a MEMS or a NEMS device. It may for example be used as a vibration energy scavenger, for example a piezoelectric vibration energy scavenger, or as a sensor device.

In a further aspect, the present disclosure further provides a method for fabrication of a resonant device. The method comprises providing a beam comprising a main body and at least one flap located along a longitudinal side of the main body, the at least one flap being physically attached to the main body, and providing a flap actuator for tuning the shape of the at least one flap, thereby tuning the stiffness of the resonant device, and hence the resonance frequency of the resonant device.

Providing a flap actuator may comprise providing a piezoelectric flap actuator. Providing a piezoelectric flap actuator may comprise providing, on the at least one flap, a piezoelectric stack comprising a bottom electrode, a piezoelectric material layer and a top electrode.

For purposes of illustrating the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

DETAILED DESCRIPTION

Figure 1:
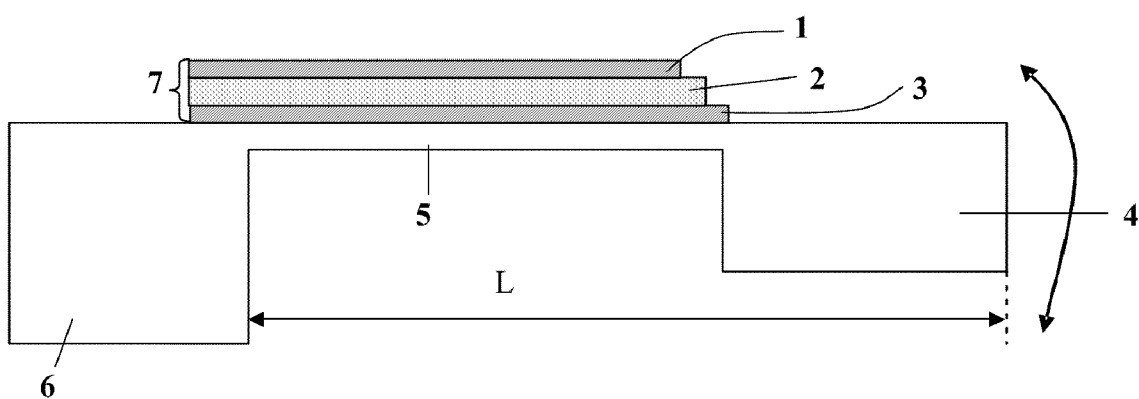
FIG. 1 is a side view of a piezoelectric vibration energy scavenger with a proof mass attached.

In the following detailed description, numerous specific details are set forth in order to provide a thorough understanding of the invention and how it may be practiced in particular embodiments. However it will be understood that the present invention may be practiced without these specific details. In other instances, well-known methods, procedures and techniques have not been described in detail, so as not to obscure the present invention. While the present invention will be described with respect to particular embodiments and with reference to certain drawings, the reference is not limited hereto. The drawings included and described herein are schematic and do not limit the scope of the invention. It is also noted that in the drawings, the size of some elements may be exaggerated and, therefore, not drawn to scale for illustrative purposes.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

The present disclosure describes methods for tuning the stiffness of a structure, e.g. a beam, such as for example a semiconductor beam such as a silicon beam, by changing its geometry. Such a method may for example be used for changing the stiffness of a structure, e.g. a structure comprising a cantilever or a beam, which is suitable for energy scavenging purposes. A method according to an alternative embodiment may for example be used for changing the stiffness of a structure, e.g. a structure comprising a cantilever or a beam, which is suitable for sensing purposes, such as for sensing mechanical properties, e.g. force sensors, pressure sensors, acceleration sensors, vibration sensors, angular rate sensors.

In certain embodiments, a structure, e.g. a cantilever structure, is provided wherein the structure, e.g. cantilever structure, comprises a main body and at least one flap physically connected to the main body.

In a method according to certain embodiments, the stiffness of the structure, e.g. cantilever structure, is changed by changing the shape of the structure without changing the shape of the main body of the structure. Instead, the stiffness of the structure, e.g. cantilever structure, is changed by changing the shape of the at least one flap connected to the main body. Changing the shape of the at least one flap may for example comprise changing a curvature of the at least one flap. A change in the stiffness of the structure results in a change of the resonance frequency.

In some embodiments, multiple structures, e.g. multiple cantilever structures, may be used, for example for increasing the efficiency of the stiffness change, and thus providing better control of the resonance behavior of the system. Such cantilever structures may for example be used in energy scavengers which have the ability to adjust their resonance frequency to the dominant ambient vibration frequency.

Hereinafter, particular embodiments are described with reference to the example of a silicon-based piezoelectric vibration energy scavenger, which comprises a one side clamped beam or cantilever attached to a proof mass and a piezoelectric stack placed on it for energy scavenging. However, the invention may be used for other types of vibration energy scavengers. Other configurations may be used for the piezoelectric scavenging stack, such as for example an interdigitated electrode configuration. The cantilever or beam may also be based on other materials than silicon, such as for example semiconductor materials (e.g. Ge, SiGe, GaAs, InGaAs), bulk ceramics, thick film or thin film ceramics (e.g. nitrides, carbides, oxides), metals (e.g. steel, aluminum), polymers (e.g. PVC, polycarbonate) or combinations of these materials.

Hereinafter a method is described wherein the stiffness of a cantilever structure is tuned by means of a piezoelectric actuating stack. However, in practicing the invention, other types of actuators may be used, such as for example magnetic actuators, electrostatic actuators, thermal actuators such as e.g. actuators based on thermal bimorphs or shape memory alloys. The illustrated and other embodiments may be used in applications other than energy scavenging, e.g. in other MEMS (Micro-Electro-Mechanical Systems) or NEMS (Nano-Electro-Mechanical Systems) devices such as RF (radio frequency) switches, nano- and micromechanical sensors, optical modulation systems, etc.

Figure 2:
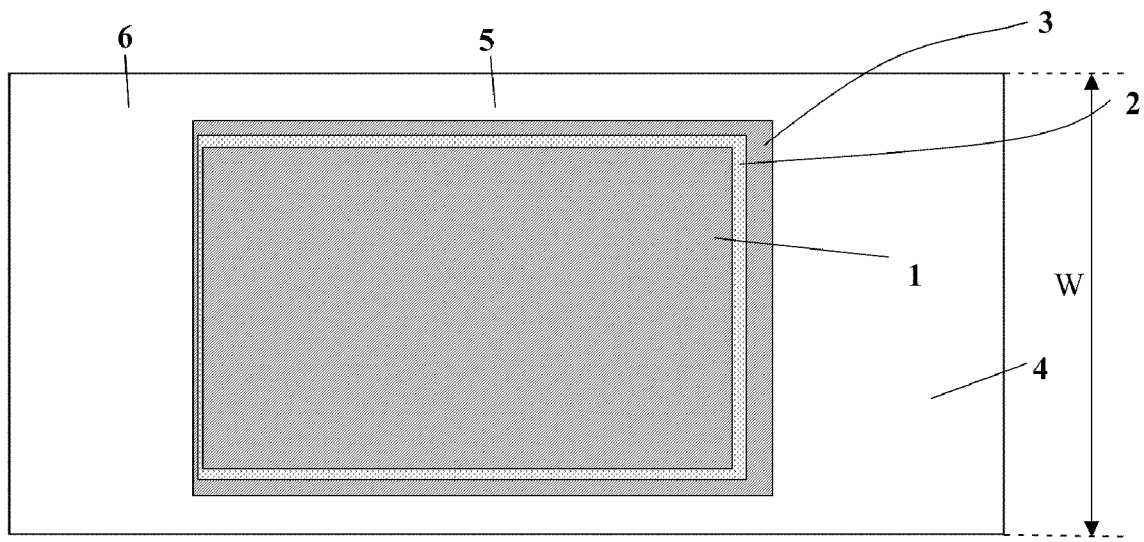
FIG. 2 is a top view of the piezoelectric vibration energy scavenger of FIG. 1

A general piezoelectric vibration scavenger is schematically shown in FIG. 1 (side view) and FIG. 2 (top view). The dimensions of the different elements and the materials used in the fabrication determine the natural frequency of the system. A seismic mass 4 may be attached to a cantilever beam 5, the cantilever beam 5 being attached to a substrate 6. The cantilever beam 5 may for example be made of semiconductor material such as e.g. silicon. The cantilever beam 5 may be made, but does not have to be made, from the same material as the substrate 6. The dimensions of the beam 5, as well as of the seismic mass 4, are strongly related to the targeted operation frequency range. For an energy harvesting device aimed to operate for example in a frequency range below 1 kHz, typical dimensions are for example a beam or cantilever length L (including the mass 4) in the range between 2 mm and 20 mm, e.g. in the range between 4 mm and 10 mm, and a beam or cantilever width W in the range between 1 mm and 15 mm, e.g. in the range between 2 mm and 7 mm. The material used for forming the mass 4 can be the same material as the material used for forming the beam or cantilever 5, but alternatively a material with a higher density or a material with a lower density may also be used for forming the mass 4, depending on the desired frequency range and the expected power output. The weight of the mass 4 may be for example in the range of a milligram to a few grams. On the beam 5, a scavenging element is provided, such as for example a piezoelectric scavenging stack 7 comprising a bottom electrode 3, a piezoelectric material layer 2 and a top electrode 1. The top and bottom electrodes 1, 3 may comprise conductive materials such as for example metals, conducting nitrides (e.g. TiN, TaN), or conducting oxides (e.g. SrRuO3, RuO2, IrO2). When the mass 4 moves up and down (as indicated by the arrows in FIG. 1), for example as a response to external vibrations, the beam 5 bends and the piezoelectric material layer 2 deforms and creates an electrical potential difference between the top electrode 1 and the bottom electrode 3. This potential difference between the electrodes can then be converted to electrical energy by proper circuitry (not illustrated).

In one application of principles of the invention the beam 5 is adapted for tuning its resonance frequency. Therefore, in one embodiments of the present invention, the beam 5 may be provided with at least one flap 52 located along a longitudinal side of the beam, (the side along the length L of the beam 5) and physically attached thereto. The stiffness of the beam 5, e.g. silicon beam 5, may then be changed by changing the shape of the at least one thin film or flap 52, located along and attached to at least one longitudinal side of the main body 51 of the beam 5. This is illustrated in FIGS. 3(*a*) and 3(*b*) and in FIG. 4. FIG. 3(*a*) is a top view of a resonant device according to embodiments of the present invention, and FIG. 3(*b*) is a cross-sectional view thereof according to line A-A'.

The end of the one or more flaps 52 at a side opposite to the side where the flaps are attached to the main body 51 of the beam 5 are free to move in a direction perpendicular to the beam surface. The at least one flap 52 can be actuated by means of suitable actuators, e.g. piezoelectric actuators, magnetic actuators, electrostatic actuators or thermal actuators. Hence, the curvature of these flaps 52 and thus the profile of the beam 5 can be changed by means of these actuators, e.g. piezoelectric actuators. Changing the curvature of the one or more flaps 52 results in a change of the stiffness of the beam structure, e.g. cantilever structure, and thus a change of the resonance frequency of the beam structure, e.g. cantilever structure. The flaps 52 and the actuators, e.g. piezoelectric actuators 8 for changing the profile of the beam 5 are shown in FIG. 3(*a*) and FIG. 3(*b*) in flat position (no actuation) and in FIG. 4 in curved position (actuated mode). As shown in FIG. 3(*a*) and FIG. 3(*b*), the actuators, in the embodiment illustrated, comprise a piezoelectric actuating stack 8 comprising a top electrode 9 and a bottom electrode 11 (e.g. Pt, Al, Ir, IrO$_2$, SrRuO$_3$, Mo, Au) and a piezoelectric material layer 10 in between (e.g. PZT, AlN, ZnO, KNbO$_3$, PVDF, LiNbO$_3$, NaWO$_3$)). As shown in FIGS. 3(*a*) and 3(*b*) and in FIG. 4, these piezoelectric actuating stacks 8 are located on a thin layer 12 of a material or a stack of materials (for example SiO$_2$/Si$_3$N$_4$) forming the flaps 52. This thin layer 12 provides electrical isolation of the piezoelectric actuating stacks 8 from other parts of the device, and thus may comprise any kind of dielectric material. However, if a non-conducting substrate 6 is used, such a thin isolating layer 12 may not be needed. On the other hand, the stress level in this thin layer 12 can be used for keeping the flaps 52 substantially flat in a non-actuated state. For example, the materials used for forming the piezoelectric actuating stacks 8 may result in a tensile stress or a compressive stress after production. This stress may be compensated by the thin layer 12. The thickness of this thin layer 12 may for example be in the range between 100 nm and 500 nm, but other thicknesses are possible, e.g. depending on the need for stress compensation. This thin layer 12 may cover the main body 51 of the beam 5 and may extend beyond the borders of the main body, thereby forming the flaps 52. By actuating the piezoelectric stack or stacks 8, i.e. by applying or changing an electrical field across the piezoelectric layer 10, mechanical stress is generated which causes the flaps 52 on which the stack is located to bend, as illustrated in FIG. 4. This bending changes the geometrical moment of inertia of the beam's cross section and consequently the beam stiffness increases. Changing the shape of the flaps 52 results in a change in the geometrical moment of inertia of the beam 5 with the flaps 52 and this leads to a change of the effective stiffness of the oscillating beam. The resonance frequency of an oscillating beam is proportional to the square root of the effective stiffness. Therefore the resonance frequency of the structure can be tuned by changing the curvature of the flaps 52 of the beam 5.

The effect of the flap curvature on the structure shown in FIG. 3(*a*), FIG. 3(*b*) and FIG. 4 was modeled. A numerical analysis of the effect of the curvature of the flaps 52 on the shift of the resonance frequency of a cantilever beam 5 was performed. Since only the flaps 52 are bending upon actuation of the actuator, e.g. the piezoelectric actuating stack 8, lack of the actual scavenging stack 7 doesn't have a significant effect on the geometrical moment of inertia, therefore it is not considered in the calculations below. For the sake of illustration, the piezoelectric material layer 10 was considered to be present only on top of the freestanding thin film 12 where it forms the flaps 52. In the calculations, a silicon cantilever beam 5 with a main body width w of 7 mm was assumed, with a thickness h in the range between 10 µm and 25 µm. Calculations were performed for different thicknesses of the piezoelectric layer 10 of the actuator stack 8 (500 nm, 1000 nm and 1500 nm) and for different piezoelectric materials (PZT (lead zirconate titanate) and AlN). A bending of the flaps 52 up to 90° was assumed, corresponding to the maximum change in geometrical moment of inertia. Furthermore, a stress-free overlapping flap 52 and actuator 8 combination is assumed (i.e. when the flaps are in no actuation condition, the bending angle is at 0°).

The material parameters and layer thicknesses used in the simulations are summarized in Table 1:

TABLE 1

| Material | Young's modulus [GPa] | Layer thickness [nm] |
| --- | --- | --- |
| Platinum (Pt) | 168 | 150 |
| Lead zirconate titanate (PZT) | 100 | 500, 1000, 1500 |
| Aluminumnitride (AlN) | 345 | 500, 1000, 1500 |
| Silicon dioxide (SiO$_2$) | 70 | 150 |
| Silicon nitride | 175 | 450 |
| Silicon | 131 | 10000-25000 |

The geometrical moment of inertia I of an area is calculated through:

$$I = \int y^2 dA \tag{1}$$

wherein y is the distance between the neutral axis and the area element dA. The geometrical moment of inertia is a measure to describe the stiffness of a beam.

A beam with a rectangular cross-section of width w and height h features a geometrical moment of inertia of:

$$\begin{aligned} I_{flat} &= \int_{x=-w/2}^{w/2} \int_{y=-h/2}^{h/2} y^2 \, dx \, dy \\ &= \int_{x=-w/2}^{w/2} dx \cdot \int_{y=-h/2}^{h/2} y^2 \, dy \\ &= \frac{wh^3}{12} \end{aligned} \tag{2}$$

The neutral axis is located at the center of the cross-section. If the cross-section is displaced from the neutral axis by a distance d the geometrical moment changes according to the parallel axis theorem.

$$I' = I + d^2 A \quad (3)$$

The geometrical moment of inertia of a bended beam can be approximated under the following assumptions:

The flap thickness is small compared to the radius of curvature. It is assumed that the neutral axis of the silicon beam, which carries additional thin films on top, is still in its center. This is valid when the additional layers have a thickness that is substantially smaller than the thickness of the silicon beam (e.g. at least a factor of 10 times smaller, preferably at least a factor of 25 times smaller).

The curvature angle is equal to or less than 90°.

Figure 5:
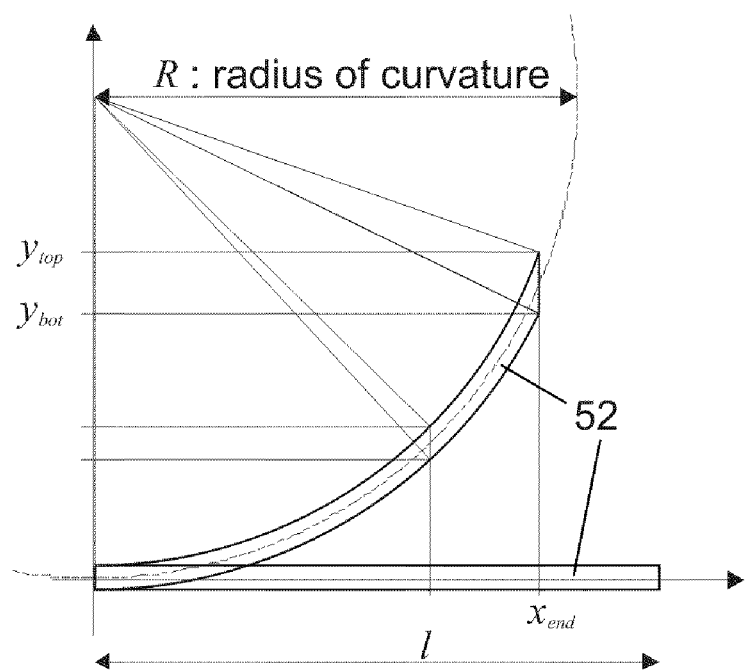
FIG. 5 is a simplified sketch of a bended flap.

A sketch of such a bended flap is shown in FIG. 5. As the flap end follows the trajectory of a circle, the lower and upper integration limits can be determined from the two circle equations:

$$x^2 + (y-R)^2 = (R+t/2)^2$$

$$x^2 + (y-R)^2 = (R-t/2)^2 \quad (4)$$

wherein t is the thickness of the flaps 52, assumed to be substantially thinner than the thickness h of the main body 51 of the silicon beam.

The ordinates of the lower and upper limits then become:

$$y_{top} = R - \sqrt{(R+t/2)^2 - x^2}$$
$$y_{bot} = R - \sqrt{(R-t/2)^2 - x^2} \quad (5)$$

With these limits, the geometrical moment of inertia can be calculated:

$$I_{curl} = \int_{x=0}^{x_{end}} \int_{y=y_{bot}}^{y_{top}} y^2 \, dx \, dy \quad (6)$$

This integral can be solved numerically.

The value of this numerical solution is then adjusted for the distance from which it is displaced with respect to the neutral axis of the silicon beam 5. Here, it is assumed that the neutral axis of the silicon beam 5, which carries an additional thin film 12 on top, is still in its center. This holds as long as the one or more thin films 12 have a thickness much smaller than the thickness h of the main body 51 of the silicon beam 5 (e.g. at least a factor of 10, preferably at least a factor of 25 smaller). In order to determine the actual stiffness, also the Young's modulus of the section's material is considered.

Figure 3A:
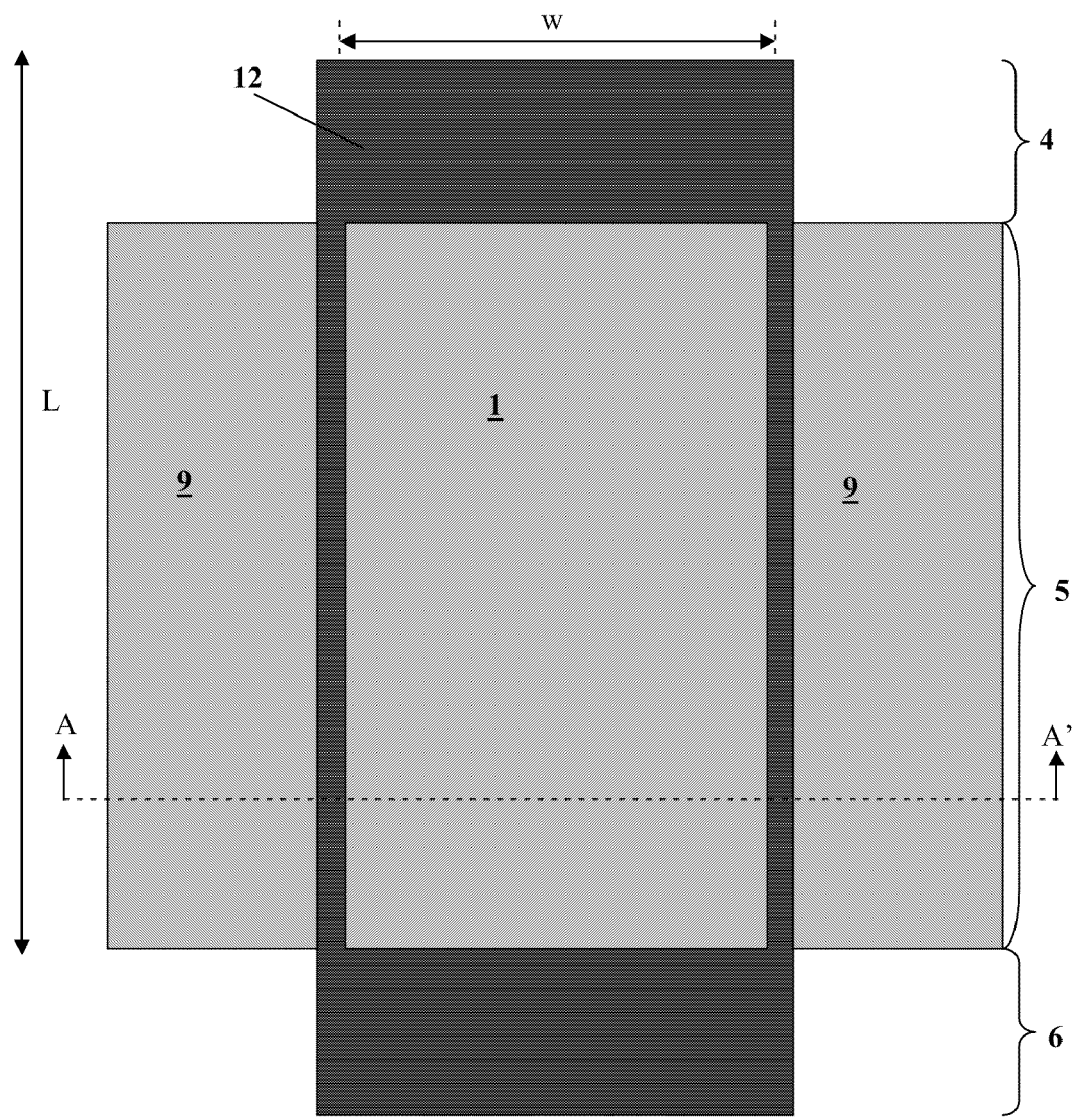
FIG. 3(a) is a top view and FIG. 3(b) is a cross-sectional view according to line A-A' in FIG. 3(a) of a scavenger beam according to embodiments of the present invention with shape changing actuators for controlling the curvature of the flaps.
Figure 3B:
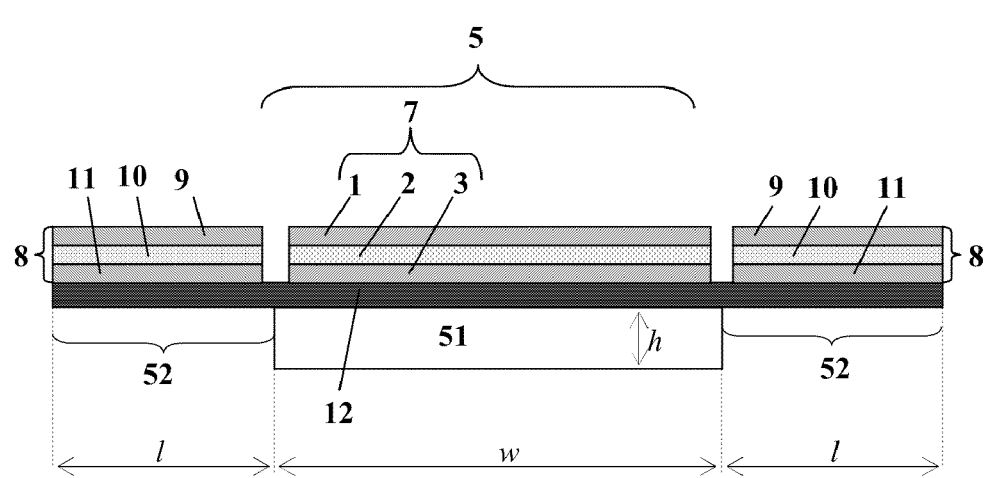
Figure 4:
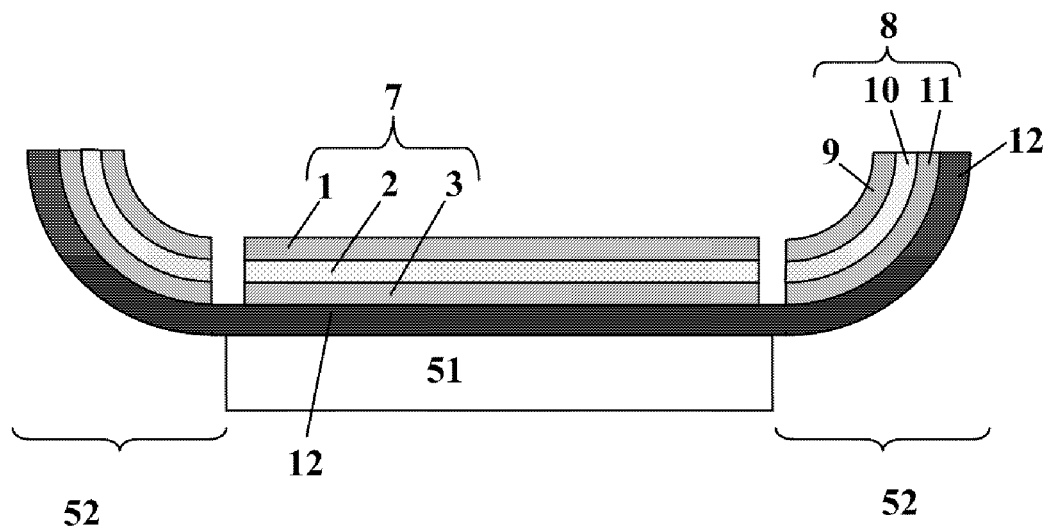
FIG. 4 is a cross-section of the scavenger beam as shown in FIG. 3(b), showing the change of the beam profile by the actuators on two sides.

A silicon beam 5 with overhanging flat flaps 52 (as shown in FIG. 3(a) and FIG. 3(b)) features a stiffness proportional to $$(YI)_{eff} = \sum_{all\, sections} Y_{mat} I_{mat} \quad (7)$$

wherein $Y_{mat}$ and $I_{mat}$ denote the Young's modulus and geometrical moment of inertia of each section of the beam. This section comprises a rectangular section, being the cross-section of the main body 51 of the beam, and the curled sections, being the cross-section of the flaps 52.

A beam with bended flaps 52 is composed of rectangular and bended sections. Equation (7) can still be used to determine the effective geometrical moment of inertia for such a beam. Equation (6) applies for calculation of the bended sections.

The extent to which the bending of the flaps 52 impacts the stiffness of the beam 5 was considered. This stiffness change will lead to a change in resonance frequency, as the resonance frequency is defined by $\omega_{res}^2 = k/m$ wherein k is the stiffness and m is the mass. The square root of the ratio of the effective stiffness of a flat beam and the effective stiffness of a beam with bended flaps can be considered as a figure of merit:

$$\eta = \sqrt{\frac{(YI)_{eff,bended}}{(YI)_{eff,flat}}} = \frac{f_{res,bended}}{f_{res,flat}} \quad (8)$$

Figure 6:
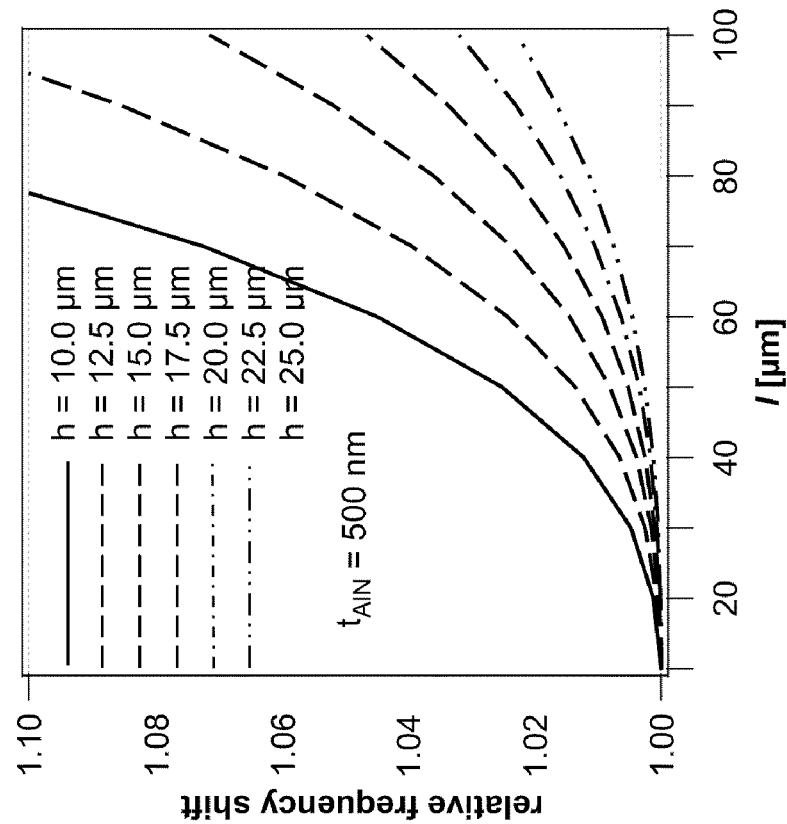
FIG. 6 shows the simulated frequency shift as a function of flap width achievable with piezoelectric actuators with 500 nm thick PZT (left) and AlN (right) layers.
Figure 6:
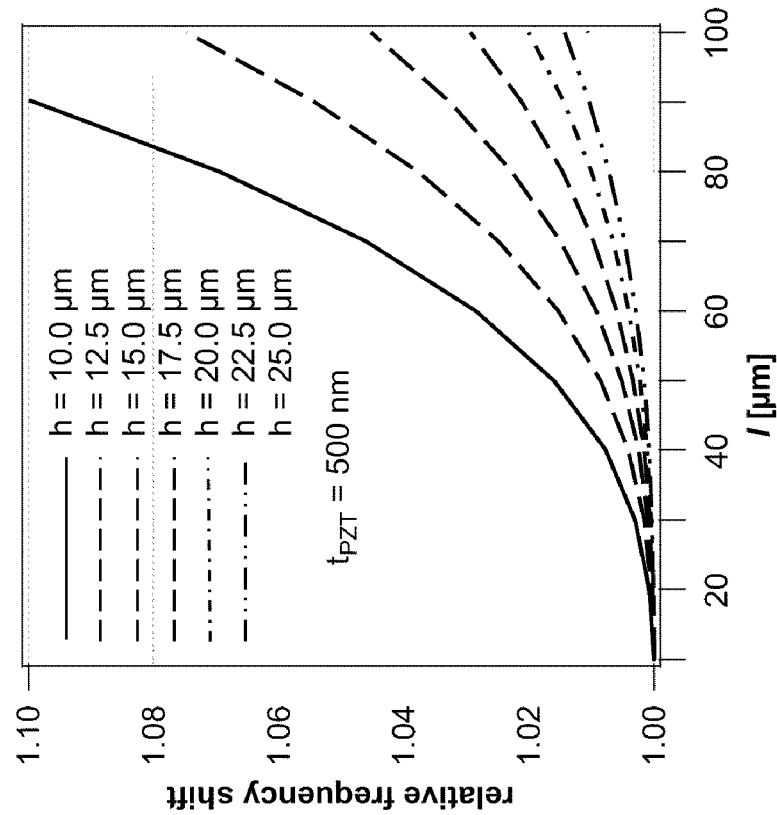
Figure 7:
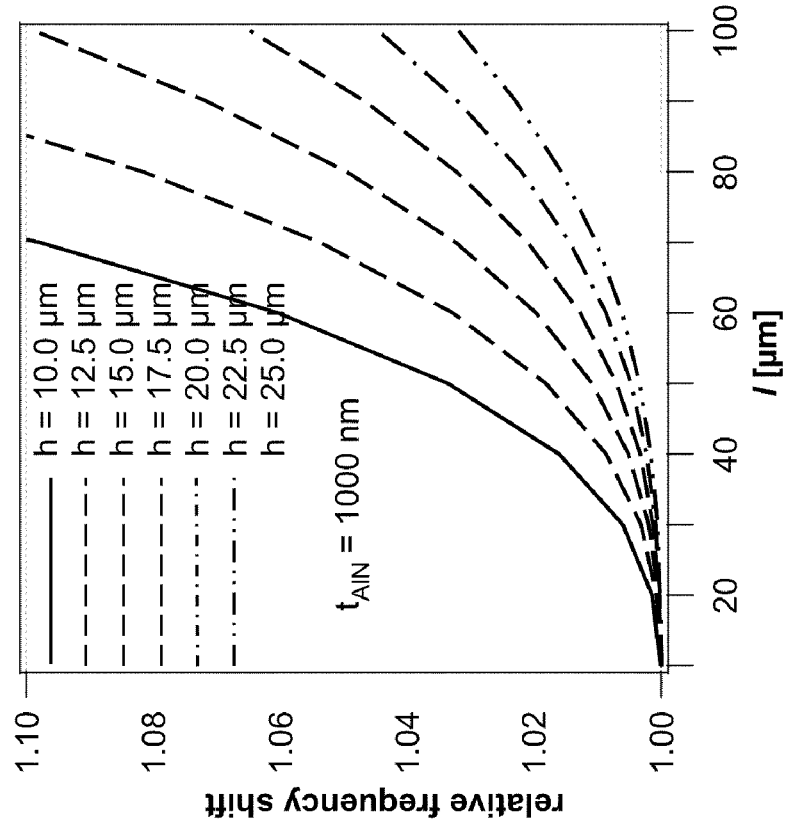
FIG. 7 shows the simulated frequency shift as a function of flap width achievable with piezoelectric actuators with 1000 nm thick PZT (left) and AlN (right) layers.
Figure 7:
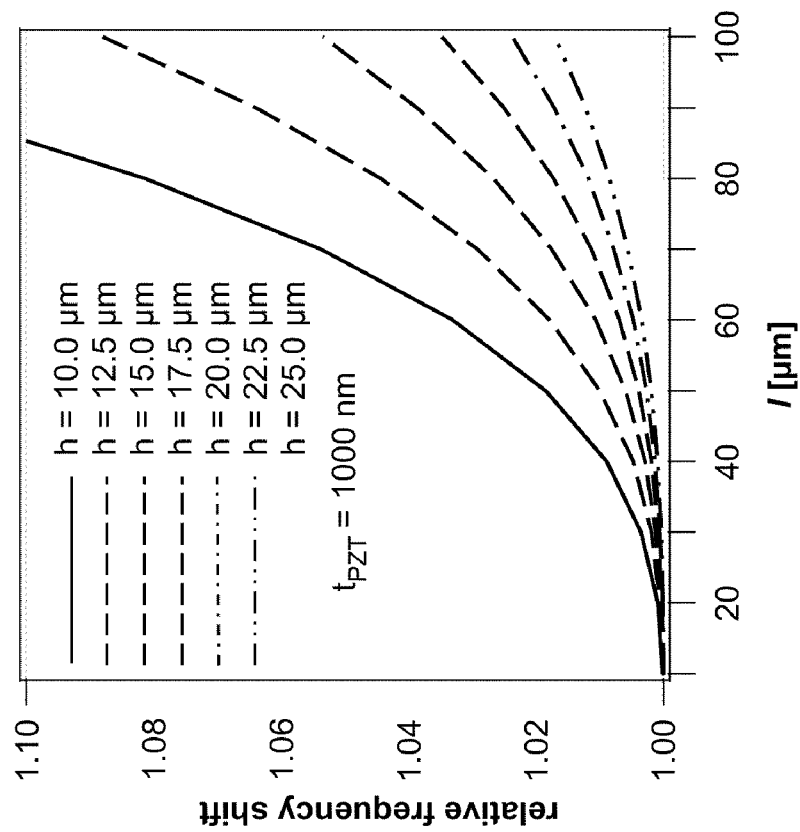
Figure 8:
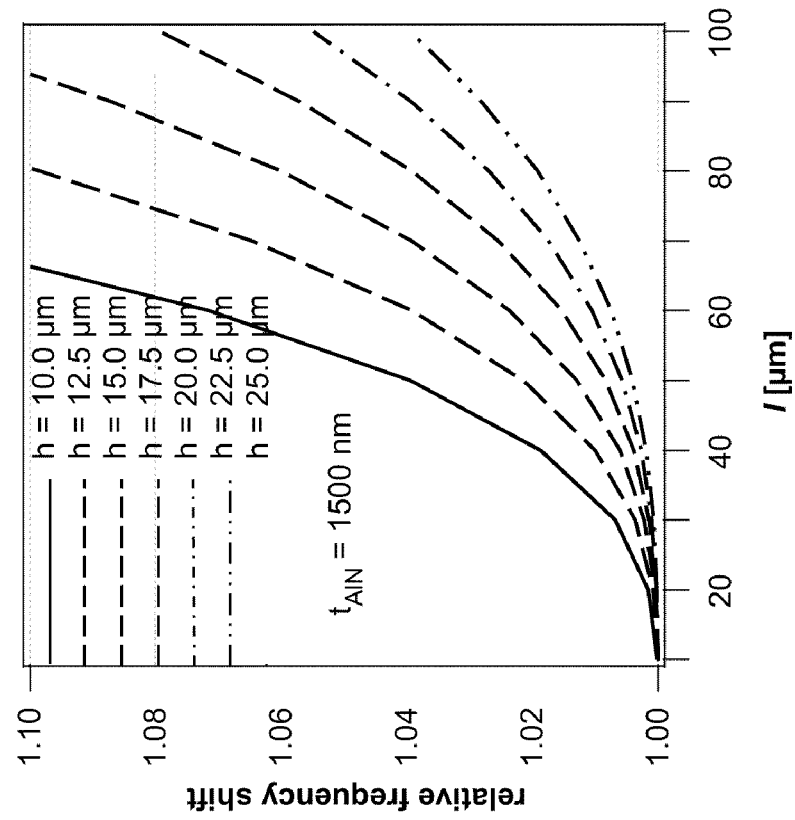
FIG. 8 shows the simulated frequency shift as a function of flap width achievable with piezoelectric actuators with 1500 nm thick PZT (left) and AlN (right) layers.
Figure 8:
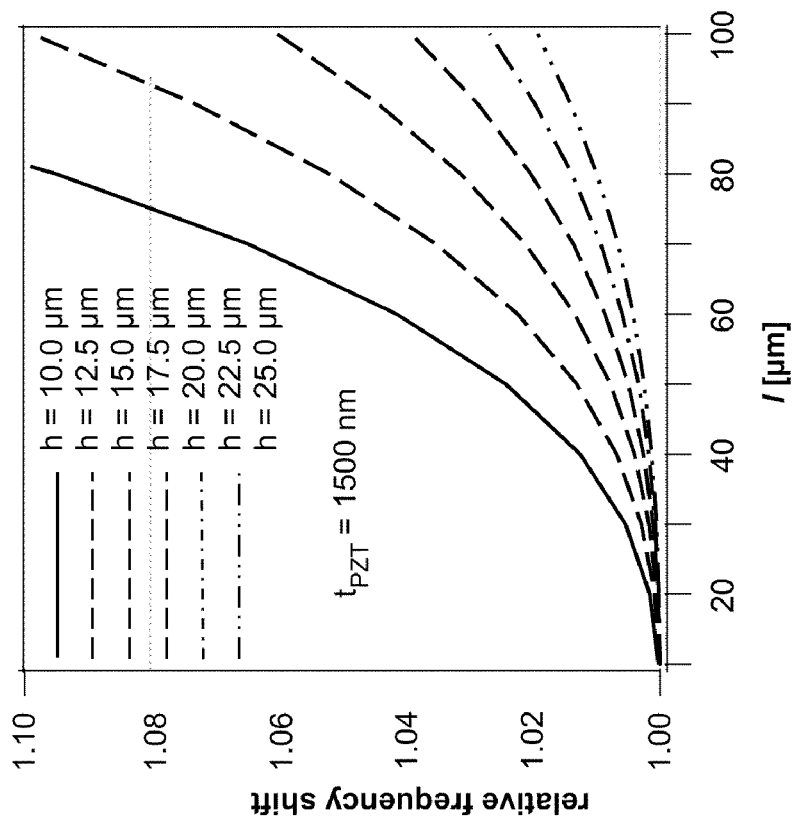

The maximum achievable frequency shift (corresponding to a 90° curvature angle) for different beam thicknesses h is given in FIG. 6 to FIG. 8 as a function of the width I of the flaps 52, for different piezoelectric layer 10 thicknesses (500 nm, 1000 nm and 1500 nm) in the piezoelectric actuating stack 8 and for different piezoelectric materials (PZT and AlN) in the actuating stack 8. The width w of the main body 51 of the silicon beam 5 is assumed to be 7 mm. The width I of the flaps 52 on either side was varied (in the range between 10 µm and 100 µm), as well as the thickness h of the main body 51 of the silicon beam 5 (10.0 µm, 12.5 µm, 15.0 µm, 17.5 µm, 20.0 µm, 22.5 µm and 25.0 µm). The results show that the resonance frequency of a 7 mm wide Si beam can be shifted up to 10% by a properly selected flap width.

Figure 9:
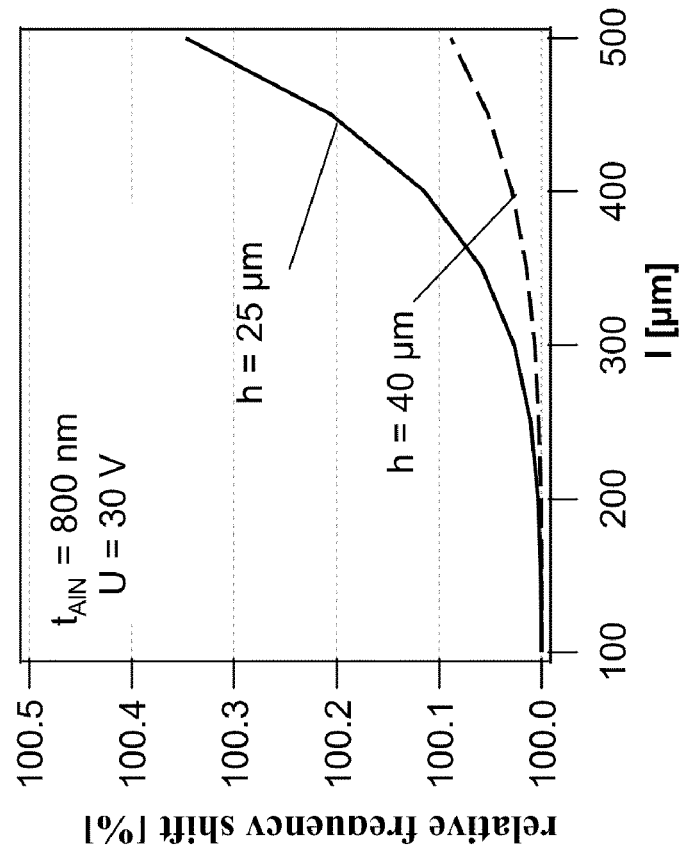
FIG. 9 shows the simulated frequency shift for a silicon beam of 7 mm width and a PZT-based (left) and AlN-based (right) tuning actuator, having a piezoelectric layer with a thickness of 800 nm and being biased with 30V.
Figure 9:
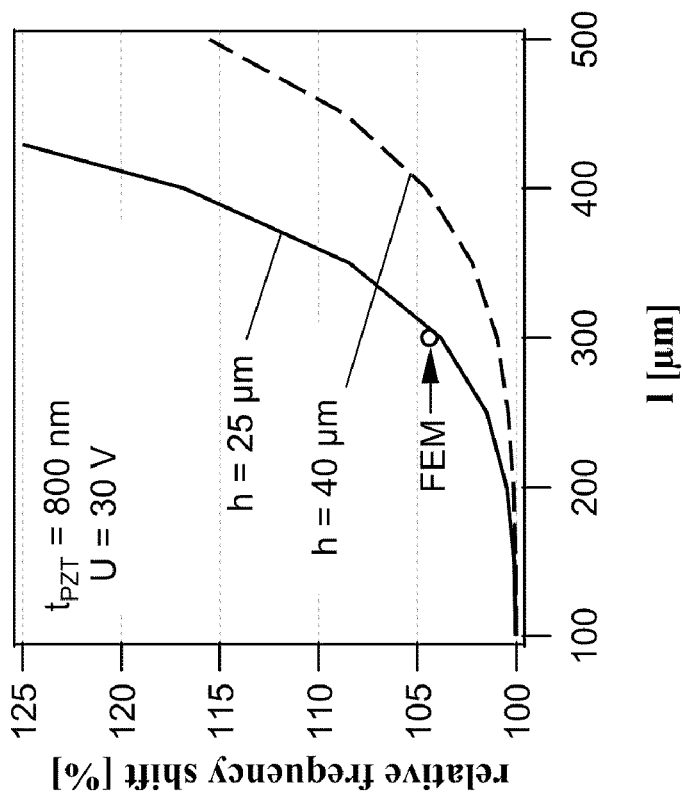

FIG. 9 shows additional simulation results, for simulations with larger flap widths I, from 100 µm up to 500 µm. It was assumed that the width w of the main body 51 of the silicon beams was 7 mm and that the tuning actuator stack 8 was biased with a voltage of 30 V. Using a finite element model, it was calculated that this leads to a radius of curvature of 730 micrometer if a 800 nm thick PZT layer 10 is used and a radius of curvature of 8150 micrometer if a 800 nm thick AlN layer 10 is used. By varying the width I of the flaps 52 on either side of the main body 51 of the beam 5 and evaluating two thickness values h of 25 µm and 40 µm respectively for the main body 51 of the silicon beam the results shown in FIG. 9 are obtained (left for a PZT piezoelectric layer 10 and right for an AlN piezoelectric layer 10). It should be noted that in FIG. 6 to FIG. 8 a curvature of 90° is assumed, and thus the maximum achievable theoretical frequency shift is shown; in FIG. 9 it is assumed that a voltage of 30V is applied (leading to a smaller curvature than in the other drawings), and thus a practically achievable frequency shift is shown. The present analytical model predicts a frequency shift of 3.81% for a PZT-based tuning actuator with a flap width of 300 micrometer. By extending the flaps to a width of 400 µm the frequency shift increases to 17%.

It is an advantage of embodiments such as those described herein that the resonance frequency can be tuned, as the frequency of input vibrations may occur in a wide spectrum, and hence a single device can be used for such wide spectrum of input vibrations. Furthermore, the frequency tuning method described herein can also be used for compensating thermally/mechanically/chemically induced drift of the resonant frequency of the devices. Thermal drift means temperature differences that create a stress gradient and/or changes of the mechanical constants (e.g. Young's modulus), which influence the resonance frequency of the device. Mechanical drift means e.g. packaging induced stress gradients, stresses caused by fabrication processes (e.g. thin film deposition processes) and degradation of mechanical and electromechanical constants by fatigue. Drift induced by chemical effects can be for example corrosion of the device components and deposition of various chemicals on device surfaces.

Since the frequency shift depends on the geometrical aspects of the beam and flaps, decreasing the ratio of the beam width w to the flap width I increases the frequency tuning efficiency. For example, splitting a wide Si beam into multiple narrower beams increases the frequency tuning efficiency and a considerable amount of frequency shift can be achieved by smaller flaps and/or lower curvatures.

Figure 10:
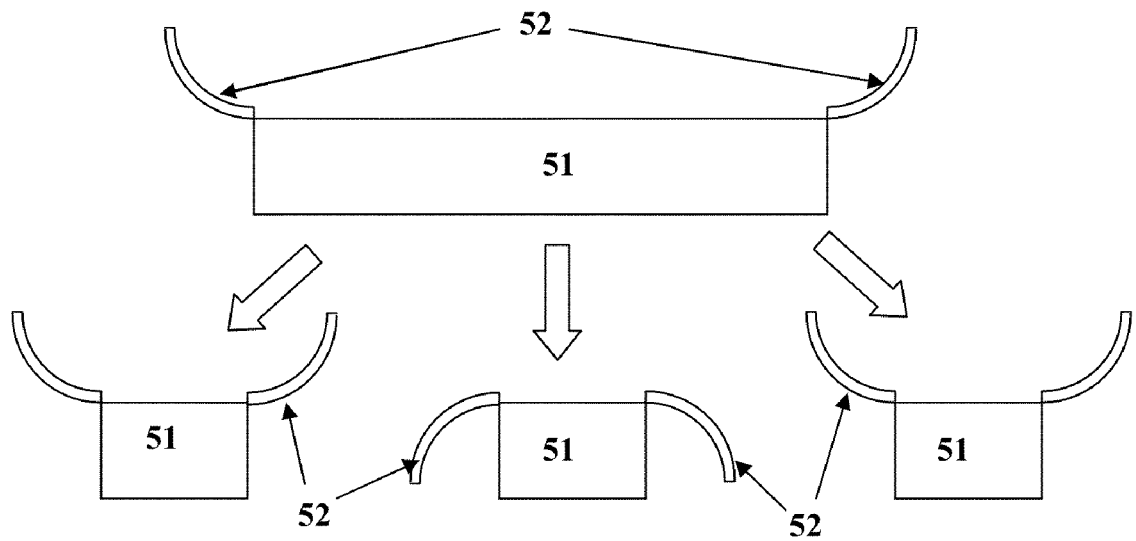
FIG. 10 illustrates splitting of a single beam with flaps into multiple beams with flaps.

Splitting of a wide beam into multiple narrower beams is illustrated in FIG. 10. In this particular case illustrated, a single beam is split into three beams. Smaller beams can be arranged in various configurations depending on the number of beams. In the example shown an u-n-u configuration is presented (u: flaps upwards; n: flaps downwards). In the case of four beams for example an u-n-n-u or an n-u-u-n configuration can be used. In particular embodiments, directional differences are preferably avoided. For example, an u-u-u configuration will not provide comparable stiffness change for upwards and downwards movements. In all configurations the smaller beams are attached to a same substrate 6 at one end and to a same seismic mass 4 at the other end.

Figure 11:
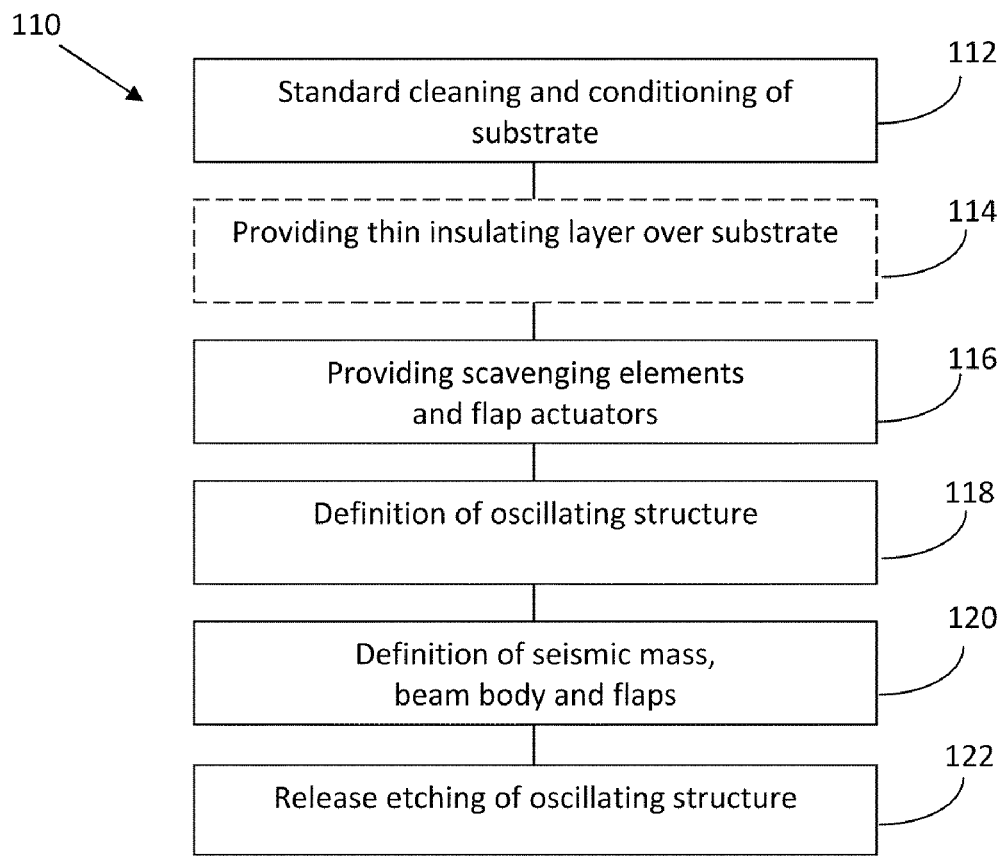
FIG. 11 illustrates a flow chart of a particular method for manufacturing a resonant device.

An example of a process flow 110 that may be used for fabricating a resonant device, e.g. a piezoelectric energy scavenger, with tuning actuators, e.g. piezoelectric tuning actuators, is described below with reference to FIG. 11. After standard cleaning and conditioning of a substrate—step 112—, e.g. silicon substrate 6, a thin layer 12, for example an insulating layer, may optionally be provided—step 114—in any suitable way, e.g. by depositing a silicon oxide layer, e.g. by means of Plasma Enhanced Chemical Vapor Deposition (PECVD), and by depositing a silicon nitride layer, e.g. by means of PECVD. The thin layer 12 can also include one or more layers.

The flaps 52 can be formed by etching away the substrate, e.g. silicon substrate underneath layer 12, while not removing the main body of the beam 5 (for example in a later stage of the process flow—step 120). However, a thin layer of substrate material, e.g. silicon, may remain underneath layer 12 as a supporting layer. In alternative embodiments, a supporting layer can be present on top of layer 12. The function of the supporting layer is enhancing the stiffness or the stability of the beam. Such supporting layer can thus be part of the substrate material or can be any other layer provided on top of layer 12 underneath the piezoelectric stack or underneath layer 12.

In alternative embodiments, where the substrate material is non-conductive, the flaps 52 can be formed from substrate material, by removing, e.g. etching, relevant parts of the substrate material so as to free the flaps (for example in a later stage of the process flow—step 120). In this case, a separate deposit of a thin layer 12 of insulating material is not necessary (but may nevertheless be performed).

Then scavenging elements, e.g. piezoelectric scavenging stacks, and flap actuators, e.g. piezoelectric flap actuators, are provided—step 116. In case of piezoelectric actuation, the bottom electrodes 3, 11 for the piezoelectric scavenging stack 7 and for the piezoelectric actuating stacks 8 are provided, e.g. deposited. This step comprises providing a conductive layer (e.g. a metal such as for example Pt, nitrides such as for example TiN or TaN, or oxides such as for example SrRuO3, RuO2, IrO2), and may optionally comprise providing an adhesion layer (e.g. Ta, Ti) between the substrate or the layer 12 and the conductive layer. The bottom electrodes 3, 11 are patterned, for example by means of lithography steps and etching procedures known by a person skilled in the art. For example, in the case of Pt bottom electrodes, ion beam etching may be used. This step may be followed by back-side patterning for further back side etching of the substrate (as described further; this step may also come later in the process flow). A piezoelectric material layer 2, 10 is then provided, e.g. by means of sputtering in case of an AlN piezoelectric layer, or by means of a sol-gel method or by sputtering in case of a PZT piezoelectric layer. However, any other deposition method available for providing thin film piezoelectric material layers known by a person skilled in the art may be used. In a next step the piezoelectric layer is patterned, for example by means of lithography steps and wet or dry etching techniques. Thereafter, the top electrodes 1, 9 are deposited and patterned, so as to complete the actuators.

After deposition and patterning of the top electrodes 1, 9 a trench patterning step can be performed on the silicon oxide/silicon nitride layer 12, for defining where to release the oscillating structure (the structure comprising the beam body 51, the flaps 52 and the seismic mass 4) from the substrate. This may be done by any method known by a person skilled in the art, for example by means of lithography. This step is related to the anisotropic silicon etching (release etching of the oscillating structure—step 122) as further described and may also come later in the process flow. After trench patterning, openings are etched in the silicon oxide/silicon nitride layer 12, for example by means of reactive ion etching or by wet etching techniques—step 118.

Next a back side etching step is performed—step 120—for the definition of the seismic mass 4 and the cantilever beam including the flaps 52. This may for example be done by means of KOH (potassium hydroxide) etching in case of a silicon substrate. However other etching techniques may be used, such as for example Deep reactive-ion etching (DRIE), depending on the substrate material and the materials used in the device layer.

This back side etching step may be followed by a release etching—step 122—, for example a TMAH (tetramethylammonium hydroxide) release etching, which is an extra step for the final step of releasing the cantilevers.

It is to be noted that the process flow described above is just a particular example of a possible flow, and that variations are possible and lie within the natural skills of a person skilled in the art.

The methods described present disclosure can be used for tuning the resonance frequency of various resonant devices, such as vibration energy scavengers, but also e.g. sensors that can operate at multiple resonance frequencies for multiple sensitivity scales. Higher resonance frequencies provide higher mass/stress sensitivity to resonant sensors. As an example, a sensor with a natural frequency of $f_0$ can be tuned to higher resonance frequencies of f1, f2, ... fn, by the method described herein. Therefore a gradually increasing sensitivity scale can be achieved.

The foregoing description details certain embodiments. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A method for tuning a resonance frequency of a structure, wherein the method comprises:

providing the structure, wherein (i) the structure comprises a beam with a main body and at least one flap located along a longitudinal side of the main body, (ii) the at least one flap is physically attached to the main body, and (iii) a thickness of the at least one flap is at least a factor of ten smaller than a thickness of the main body; and tuning a shape of the at least one flap, thereby tuning a stiffness of the structure.

2. The method of claim 1, wherein tuning the shape of the at least one flap comprises tuning a curvature of the at least one flap.

3. The method of claim 1, wherein tuning the shape of the at least one flap comprises actuating a piezoelectric actuator on the at least one flap.

4. The method of claim 1, wherein the structure is one of a vibration energy scavenger and a sensor.

5. A resonant device with tunable resonance frequency, the resonant device comprising:
   at least one beam comprising a main body and at least one flap located along a longitudinal side of the main body, wherein (i) the at least one flap is physically attached to the main body and (ii) a thickness of the at least one flap is at least a factor of ten smaller than a thickness of the main body; and
   means for changing a shape of the at least one flap.

6. The resonant device of claim 5, wherein the means for changing the shape of the at least one flap comprise a piezoelectric stack comprising a bottom electrode, a piezoelectric material layer, and a top electrode, wherein the piezoelectric stack is located on a surface of the at least one flap.

7. The resonant device of claim 5, further comprising a seismic mass attached to the at least one beam.

8. The resonant device of claim 5, wherein the at least one beam is a cantilever structure.

9. The resonant device of claim 5, wherein the at least one beam is clamped at two sides.

10. The resonant device of claim 5, wherein the resonant device is one of a micro-electro-mechanical system device and a nano-electro-mechanical device.

11. The resonant device of claim 5, wherein the resonant device is one of a vibration energy scavenger and a sensor.

12. A method of fabricating a resonant device, the method comprising:
   providing a beam comprising a main body and at least one flap located along a longitudinal side of the main body, wherein (i) the at least one flap is physically attached to the main body, and (ii) a thickness of the at least one flap is at least a factor of ten smaller than a thickness of the main body; and
   providing a flap actuator for tuning the shape of the at least one flap, thereby tuning the stiffness of the resonant device.

13. The method of claim 12, wherein providing the flap actuator comprises providing a piezoelectric actuator.

14. The method of claim 12, further comprising using the resonant device as one of a vibration energy scavenger and a sensor.

* * * * *